(12) United States Patent
Yoshimura et al.

(10) Patent No.: US 8,110,900 B2
(45) Date of Patent: Feb. 7, 2012

(54) MANUFACTURING PROCESS OF SEMICONDUCTOR DEVICE AND SEMICONDUCTOR DEVICE

(75) Inventors: Yasuhiro Yoshimura, Kasumigaura (JP); Naotaka Tanaka, Kasumigaura (JP); Michihiro Kawashita, Hitachinaka (JP); Takahiro Naito, Duesseldorf (DE); Takashi Akazawa, Musashimurayama (JP)

(73) Assignee: Renesas Electronics Corporation, Kanagawa (JP)

( * ) Notice: Subject to any disclaimer, the term of this patent is extended or adjusted under 35 U.S.C. 154(b) by 344 days.

(21) Appl. No.: 12/360,466

(22) Filed: Jan. 27, 2009

(65) Prior Publication Data

US 2009/0189256 A1    Jul. 30, 2009

(30) Foreign Application Priority Data

Jan. 29, 2008    (JP) .................................. 2008-017141

(51) Int. Cl.
*H01L 29/40*    (2006.01)

(52) U.S. Cl. ........ 257/621; 257/510; 257/698; 257/774; 257/E21.597; 257/E23.011; 438/613; 438/637; 438/739; 438/666; 438/668; 438/672; 438/675

(58) Field of Classification Search .................. 257/510, 257/621, 698, 774, E21.585, E21.597, E23.011; 438/613, 637–739, FOR. 363

See application file for complete search history.

(56) References Cited

U.S. PATENT DOCUMENTS

| | | | |
|---|---|---|---|
| 6,838,362 B2* | 1/2005 | Mastromatteo et al. | 438/524 |
| 7,410,884 B2* | 8/2008 | Ramanathan et al. | 438/455 |
| 2005/0003649 A1* | 1/2005 | Takao | 438/612 |
| 2005/0189637 A1* | 9/2005 | Okayama et al. | 257/679 |
| 2006/0087042 A1* | 4/2006 | Kameyama et al. | 257/774 |
| 2006/0108691 A1* | 5/2006 | Kameyama et al. | 257/758 |
| 2006/0202348 A1* | 9/2006 | Kameyama et al. | 257/774 |
| 2007/0161235 A1* | 7/2007 | Trezza | 438/667 |
| 2007/0241457 A1* | 10/2007 | Ida | 257/738 |
| 2009/0057922 A1* | 3/2009 | Lee et al. | 257/778 |
| 2009/0065907 A1* | 3/2009 | Haba et al. | 257/621 |

(Continued)

FOREIGN PATENT DOCUMENTS

JP    2002-289623    10/2002

(Continued)

OTHER PUBLICATIONS

Cornelia K. Tsang, et al., "CMOS—Compatible Through Silicon Vias for 3D Process, Integration", Mater. Res. Soc. Symp. Proc. vol. 970, 2007.

(Continued)

*Primary Examiner* — Meiya Li
(74) *Attorney, Agent, or Firm* — Mattingly & Malur, PC

(57) ABSTRACT

After forming a ring-shaped trench penetrating through a semiconductor substrate from a rear surface side thereof and forming an insulating film inside the trench and on the rear surface of the semiconductor substrate, a through hole is formed in the insulating film and semiconductor substrate on an inner side of the ring-shaped trench from the rear surface side, thereby exposing a surface protection insulating film formed on a front surface of the semiconductor substrate at a bottom of the through hole. After removing the surface protection insulating film at the bottom of the through hole to form an opening to expose an element surface electrode, a contact electrode connected to the element surface electrode is formed on inner walls of the through hole and opening, and a pad electrode made of the same layer as the contact electrode is formed on the rear surface of the semiconductor substrate.

5 Claims, 11 Drawing Sheets

U.S. PATENT DOCUMENTS

2009/0140381 A1* 6/2009 Lin et al. .................. 257/528

FOREIGN PATENT DOCUMENTS

| JP | 2005-340389 | 12/2005 |
|---|---|---|
| JP | 2006-210745 | 8/2006 |
| JP | 2006-286677 | 10/2006 |
| JP | 2007-053149 | 3/2007 |
| JP | 2008-085226 | 4/2008 |

OTHER PUBLICATIONS

The Disruptive Semiconductor Technologies Magazine, Micronews, Issue No. 5, May 2008, pp. 1-20.

Byeung-Gee Kim, et al., "The Reliability of 30 μm pitch COG joints fabricated using Sn/Cu bumps and non-conductive adhesive", Electronic Materials and Packaging, EMAP 2007, International Conference, Nov. 2007.

* cited by examiner

MANUFACTURING PROCESS OF SEMICONDUCTOR DEVICE AND SEMICONDUCTOR DEVICE

CROSS-REFERENCE TO RELATED APPLICATION

The present application claims priority from Japanese Patent Application No. JP 2008-017141 filed on Jan. 29, 2008, the content of which is hereby incorporated by reference into this application.

TECHNICAL FIELD OF THE INVENTION

The present invention relates to a manufacturing technique of a semiconductor device and a semiconductor device, and more particularly to a technique effectively applied to a manufacturing process of a semiconductor device in which a plurality of semiconductor chips are three-dimensionally stacked.

BACKGROUND OF THE INVENTION

With the size reduction of electronic equipment, higher integration and further size reduction of a semiconductor device to be mounted therein have been required. Therefore, the system-in-package technology for densely packaging a plurality of semiconductor chips having integrated circuits formed therein and realizing a high-performance system in a short period of time has attracted attention and various packaging structures have been proposed.

For example, the development of a stacked package capable of achieving the size reduction by three-dimensionally stacking a plurality of semiconductor chips has been advanced. In the case of the stacked package, the stacked semiconductor chips are electrically connected by using a through electrode. The through electrode has a structure in which an electrode formed on a main surface (element forming surface, circuit forming surface) of a semiconductor substrate on which integrated circuits are formed and an electrode formed on a surface opposite to the main surface are connected via an electrode formed inside a through hole formed in the semiconductor substrate serving as a base material of the semiconductor chip.

Since a conventional semiconductor device has a structure in which several insulating layers and wiring layers are stacked on a main surface of a semiconductor substrate, exposure process is adopted only to a main surface side of the semiconductor substrate in the manufacturing process thereof. Therefore, even when the through electrode as described above is to be formed, the process from the main surface of the semiconductor substrate is performed.

For example, Japanese Patent Application Laid-Open Publication No. 2002-289623 (patent document 1) has disclosed a technique comprising the steps of: forming a hole and a trench surrounding the hole in a semiconductor substrate; forming a conductive material at least in the hole; forming an insulating material at least in the trench; and then removing a region on a rear surface side of the semiconductor substrate to expose the conductive material formed in the hole and the insulating material formed in the trench, thereby forming a conductive plug made of the conductive material formed in the hole and an insulating region made of the insulating material formed in the trench.

Also, Japanese Patent Application Laid-Open Publication No. 2007-53149 (patent document 2) has disclosed a technique comprising the steps of: forming a through hole whose opening has a cone shape from a rear surface of a semiconductor substrate; depositing an insulating film; removing a part of the insulating film to be a contact portion at the bottom of the through hole and forming a metal seed layer by sputtering; forming a metal layer by plating on a part of the metal seed layer including the through hole; and then processing the metal seed layer, thereby forming a pad and a wiring in the part including the through hole.

SUMMARY OF THE INVENTION

A through electrode is required for the multilayer stacking of semiconductor chips. In the manufacturing process of the through electrode, a through hole is formed in a semiconductor substrate from a main surface side of the semiconductor substrate by the dry etching using plasma in general. However, the etching depth is relatively large and is, for example, 20 to 500 μm. Therefore, with the increase in the etching depth, the etching time is correspondingly increased, the semiconductor wafer is exposed to plasma for a long time, and the influence of the plasma on the semiconductor elements formed on the semiconductor substrate is also increased. For example, problems such as the increase of the surface temperature of the semiconductor substrate and the breakage of the semiconductor elements by the plasma field are caused.

Further, in the manufacturing process of the through electrode, after forming a through hole in a semiconductor substrate from a main surface side of the semiconductor substrate, an insulating film is formed on an inner wall of the through hole in order to insulate the through electrode and the semiconductor substrate, and thereafter, the electrode is formed inside the through hole. At this time, after reducing the thickness of the semiconductor substrate by grinding the rear surface of the semiconductor substrate by CMP (Chemical Mechanical Polishing), the insulating film at the bottom of the through hole is removed by the wet etching or the dry etching, thereby exposing the electrode inside the through hole. However, since at least two steps of grinding the semiconductor substrate and removing the insulating film at the bottom of the through hole are required for grinding the rear surface of the semiconductor substrate, it takes long time and there is a fear of the cost increase.

An object of the present invention is to provide a technique capable of reducing the manufacturing cost of a semiconductor device having a through electrode.

Another object of the present invention is to provide a technique capable of improving the manufacturing yield of a semiconductor device having a through electrode.

The above and other objects and novel characteristics of the present invention will be apparent from the description of this specification and the accompanying drawings.

The typical ones of the inventions disclosed in this application will be briefly described as follows.

An embodiment of the present invention is a manufacturing process of a semiconductor device having a through electrode composed of a first electrode formed on a front surface side of a semiconductor substrate, a second electrode formed on a rear surface side, and a third electrode connecting the first electrode and the second electrode. First, after grinding the semiconductor substrate to have a predetermined thickness, a ring-shaped trench penetrating through the semiconductor substrate is formed from the rear surface side of the semiconductor substrate, and an insulating film is formed inside the ring-shaped trench and on the rear surface of the semiconductor substrate. Thereafter, a through hole is formed in the insulating film and the semiconductor substrate on an inner side of the ring-shaped trench from the rear surface side of the semiconductor substrate, whereby a surface protection insulating film formed on the front surface of the semiconductor substrate is exposed at the bottom of the through hole. Subsequently, the surface protection insulating film exposed at the bottom of the through hole is removed to form an opening, thereby exposing the first electrode. Then, the third electrode connected to the first electrode is formed on the inner walls of the through hole and the opening, and at the same time, the second electrode made of the same layer as the third electrode is formed on the rear surface of the semiconductor substrate around the through hole.

Another embodiment of the present invention is a semiconductor device having a through electrode composed of a first electrode formed on a front surface side of a semiconductor substrate, a second electrode formed on a rear surface side, and a third electrode connecting the first electrode and the second electrode. The through electrode includes a first electrode, a through hole penetrating from a front surface to a rear surface of the semiconductor substrate, a third electrode formed on an inner wall of the through hole and connected to the first electrode, and a second electrode made of the same layer as the third electrode and formed on the rear surface of the semiconductor substrate around the through hole. Further, a ring-shaped trench formed in the semiconductor substrate around the through hole so as to have a predetermined distance from the through hole and an insulating film formed inside the ring-shaped trench and between the rear surface of the semiconductor substrate and the second electrode are provided.

The effects obtained by typical one of the inventions disclosed in this application will be briefly described below.

The manufacturing cost of a semiconductor device having a through electrode can be reduced. Also, since the through electrode can be formed without breaking semiconductor elements, the manufacturing yield of a semiconductor device having a through electrode can be improved.

BRIEF DESCRIPTIONS OF THE DRAWINGS

Figure 20:
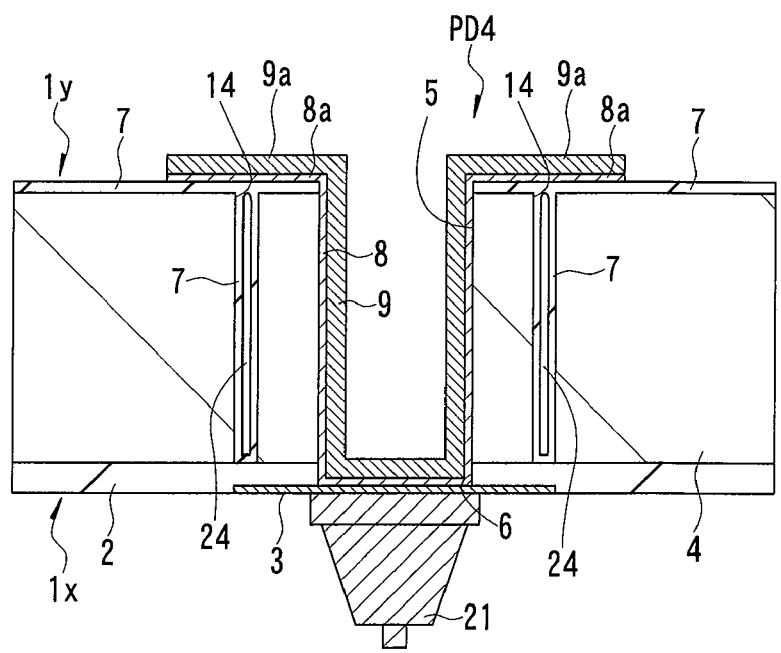
Figure 21:
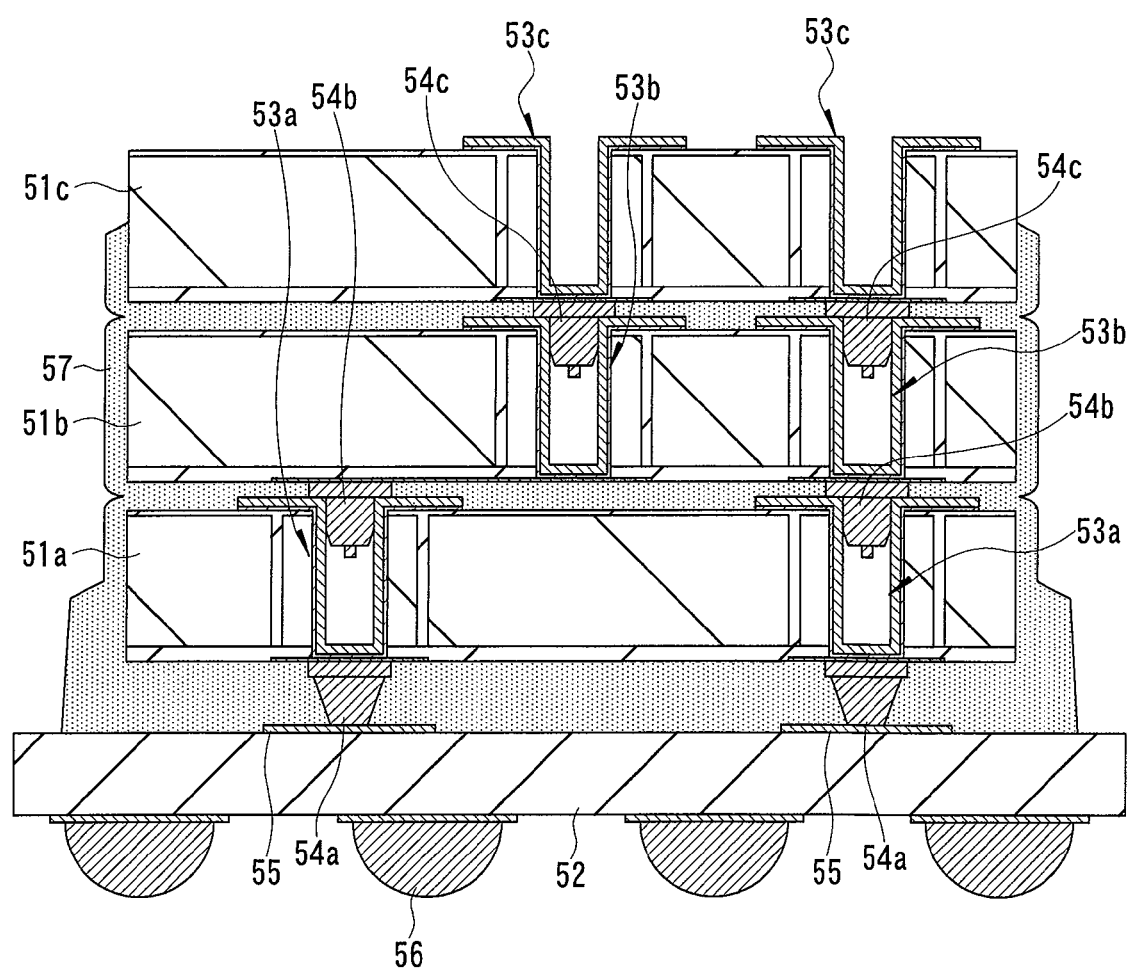

FIG. 20 is a cross-sectional view of the principal part of a through electrode of a semiconductor device according to the fourth embodiment of the present invention; and FIG. 21 is a cross-sectional view of the principal part of a semiconductor device with a SIP structure in which semiconductor chips are three-dimensionally formed and stacked according to the fifth embodiment of the present invention.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Also, in the drawings used in the embodiments, hatching is used in some cases even in a plan view so as to make the drawings easy to see. Also, when referring to a wafer in the embodiments described below, a single crystal Si (silicon) wafer is mainly mentioned, but other wafers such as an SOI (Silicon On Insulator) wafer and an insulating film substrate for forming an integrated circuit thereon are also included. The shape of the wafer is not limited to a circular shape and an approximately circular shape, and a square shape, a rectangular shape and others are also included. Further, in the manufacture of a semiconductor device, a semiconductor substrate itself is referred to as a semiconductor wafer in some cases, and a semiconductor substrate on which an integrated circuit is mounted in the course of the manufacture of a semiconductor device or a semiconductor substrate on which an integrated circuit is mounted after the manufacture is completed is also referred to as a semiconductor wafer in some cases. In the embodiments described below, a semiconductor substrate on which an integrated circuit is mounted and a plurality of chip regions (device regions) are formed is mainly referred to as a semiconductor wafer.

Also, components having the same function are denoted by the same reference numbers in principle throughout the drawings for describing the embodiments, and the repetitive description thereof will be omitted. Hereinafter, embodiments of the present invention will be described in detail with reference to the accompanying drawings.

The manufacturing process of a semiconductor device is classified into a front-end process and a back-end process in general. The front-end process is also referred to as a wafer process, in which a plurality of chip regions each separated by scribe lines and having an integrated circuit and a plurality of electrode pads are formed. The back-end process is also referred to as an assembly process, in which the semiconductor substrate on which the plurality of chip regions are formed is divided along the scribe lines to form a plurality of semiconductor chips and the semiconductor chips are assembled into various types of packages. In the embodiments below, the front-end process in the manufacture of a semiconductor device will be mainly described.

First Embodiment

Figure 1:
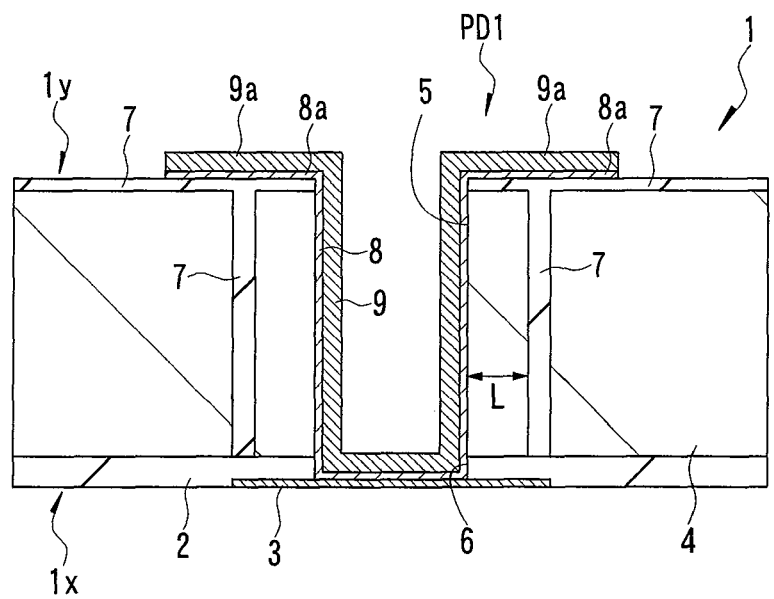
FIG. 1 is a cross-sectional view of the principal part of a through electrode of a semiconductor device according to the first embodiment of the present invention.
Figure 2:
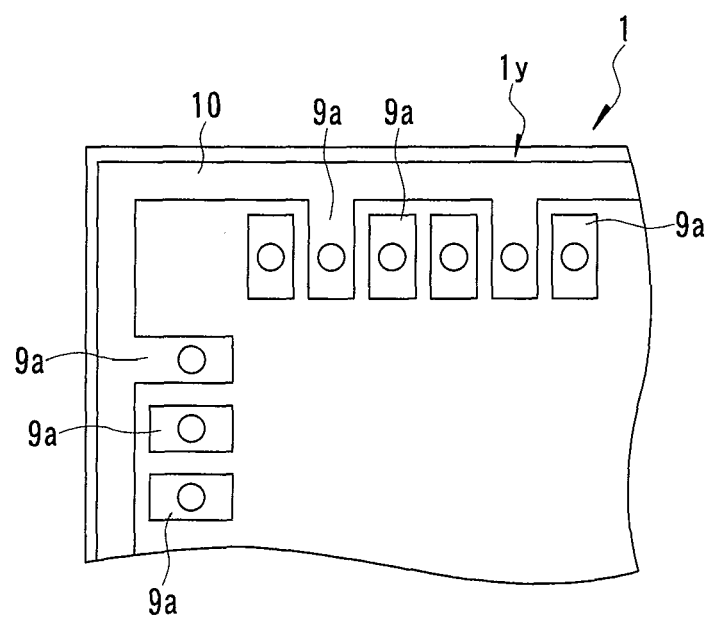
FIG. 2 is a plan view of the principal part of the through electrode of the semiconductor device according to the first embodiment of the present invention.

A through electrode of a semiconductor device according to the first embodiment will be described with reference to FIG. 1 and FIG. 2. FIG. 1 is a cross-sectional view of the principal part of the through electrode of the semiconductor device, and FIG. 2 is a plan view of the principal part of the through electrode of the semiconductor device.

As shown in FIG. 1, a through electrode PD1 includes a first electrode (element surface electrode 3) formed on a first surface 1x side of a semiconductor wafer 1, a second electrode (pad electrode 9a) formed on a second surface 1y side opposite to the first surface 1x, and a third electrode (contact electrode 9) which electrically connects the first and second electrodes and is formed so as to penetrate through a semiconductor substrate 4 as a base material of the semiconductor wafer 1.

A semiconductor element (not shown) and a surface protection insulating film (first insulating film) 2 covering the semiconductor element are formed on the first surface 1x of the semiconductor wafer 1. Further, the element surface electrode 3 which is electrically connected to the semiconductor element and to which a bump (not shown) is directly connected is formed on the first surface 1x of the semiconductor wafer 1.

In the semiconductor substrate 4 as a base material of the semiconductor wafer 1, a through hole 5 penetrating from a main surface (first surface, front surface) thereof to a surface opposite to the main surface (second surface, rear surface) is formed. A diameter of the through hole 5 is, for example, 5 to 40 μm. Further, an opening 6 connected to this through hole 5 and reaching the element surface electrode 3 is formed in the surface protection insulating film 2 formed on the first surface 1x side of the semiconductor wafer 1. A ring-shaped insulating film (second insulating film) 7 reaching the rear surface from the front surface of the semiconductor substrate 4 is formed in the semiconductor substrate 4 around the through hole 5 with a predetermined interval from the through hole 5. This insulating film 7 is formed also on the rear surface of the semiconductor substrate 4. The distance L between the through hole 5 and the ring-shaped insulating film 7 is, for example, 0 to 20 μm.

Further, a seed layer 8 is formed on inner walls of the through hole 5 and the opening 6 so as to be in contact with the element surface electrode 3, a contact electrode 9 is formed on the seed layer 8, and the element surface electrode 3 and the contact electrode 9 are electrically connected to each other. A seed layer 8a and a pad electrode 9a are formed around the through hole 5 on the insulating film 7 formed on the rear surface of the semiconductor substrate 4, and the seed layer 8 and the contact electrode 9 formed on the inner walls of the through hole 5 and the opening 6 and the seed layer 8a and the pad electrode 9a formed around the through hole 5 on the rear surface of the semiconductor substrate 4 are made of the same conductive materials of the same layers, respectively. Also, the semiconductor substrate 4 on an inner side of the ring-shaped insulating film 7 and the contact electrode 9 are electrically connected to each other, but the semiconductor substrate 4 on an outer side of the ring-shaped insulating film 7 and the contact electrode 9 are electrically insulated to each other in this structure.

As shown in FIG. 2, a plurality of pad electrodes 9a are exposed on a second surface 1y side of the semiconductor wafer 1. Also, a wiring 10 is formed on the second layer 1y side of the semiconductor wafer 1, and a ground wiring or others can be formed by connecting a pad electrode 9a and another pad electrode 9a with the wiring 10.

Figure 15:
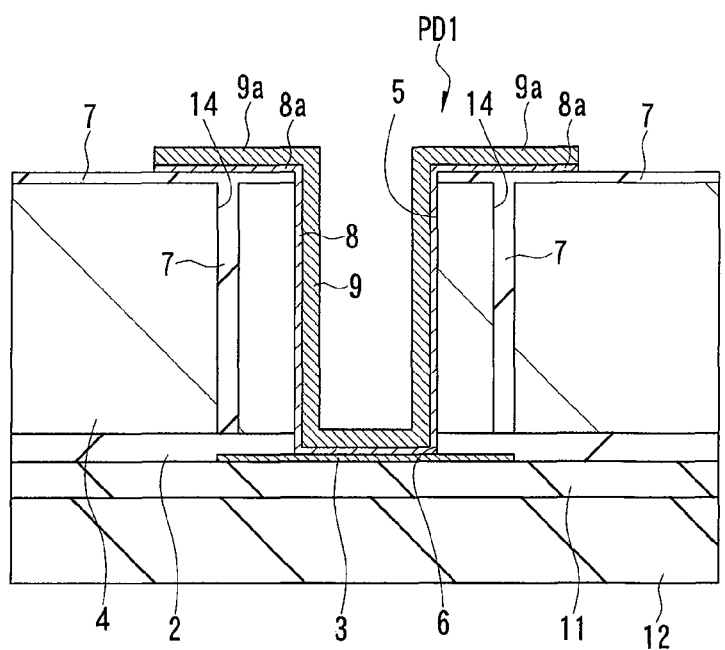
FIG. 15 is a cross-sectional view of the principal part of the same portion as FIG. 3 showing the through electrode of the semiconductor device continued from FIG. 14.
Figure 16:
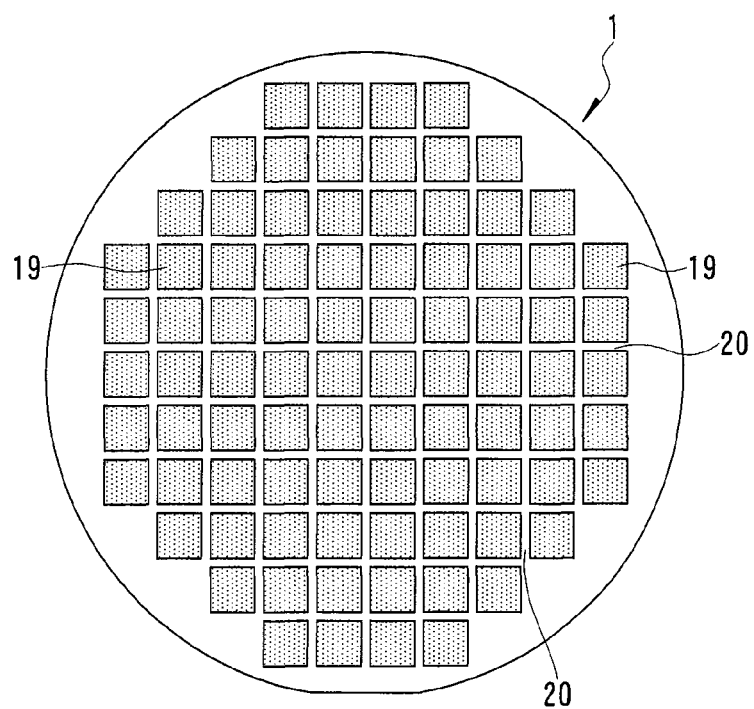
FIG. 16 is a plan view of the principal part showing an example of an array of semiconductor chips in a semiconductor wafer according to the first embodiment of the present invention.

Next, the manufacturing process of the through electrode of the semiconductor device according to the first embodiment will be described in order of the manufacturing steps with reference to FIG. 3 to FIG. 17. FIGS. 3 to 15 and FIG. 17 are cross-sectional views of the principal part of the through hole of the semiconductor device, and FIG. 16 is a plan view of the principal part showing an example of an array of semiconductor chips in a semiconductor wafer.

Figure 3:
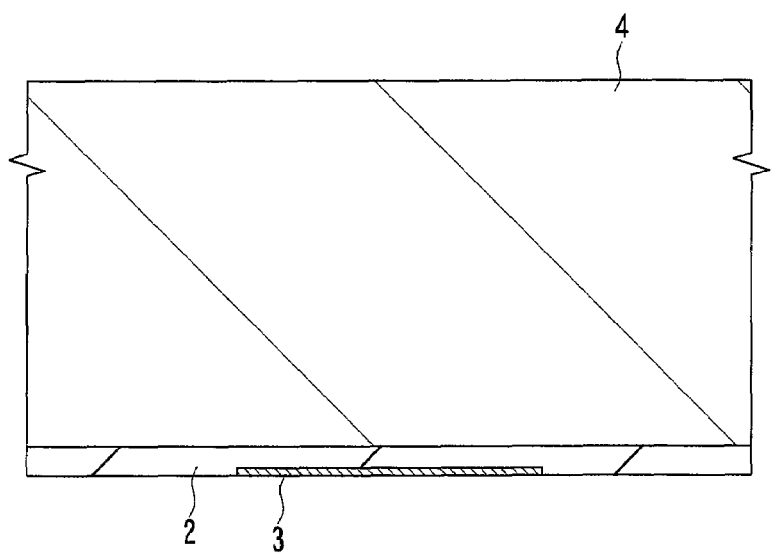
FIG. 3 is a cross-sectional view of the principal part in a manufacturing process of the through electrode of the semiconductor device according to the first embodiment of the present invention.

First, as shown in FIG. 3, an integrated circuit is formed on a front surface of the semiconductor substrate 4. The integrated circuit is formed in units of chip on a semiconductor wafer through the known manufacturing process called a front-end process or a diffusion process. The semiconductor substrate 4 is made of single crystal silicon, and the diameter thereof is, for example, 300 mm and the thickness thereof is, for example, 700 μm or more. The integrated circuit is covered with the surface protection insulating film 2, and the element surface electrode 3 electrically connected to the integrated circuit is formed so as to be exposed on the surface protection insulating film 2.

Figure 4:
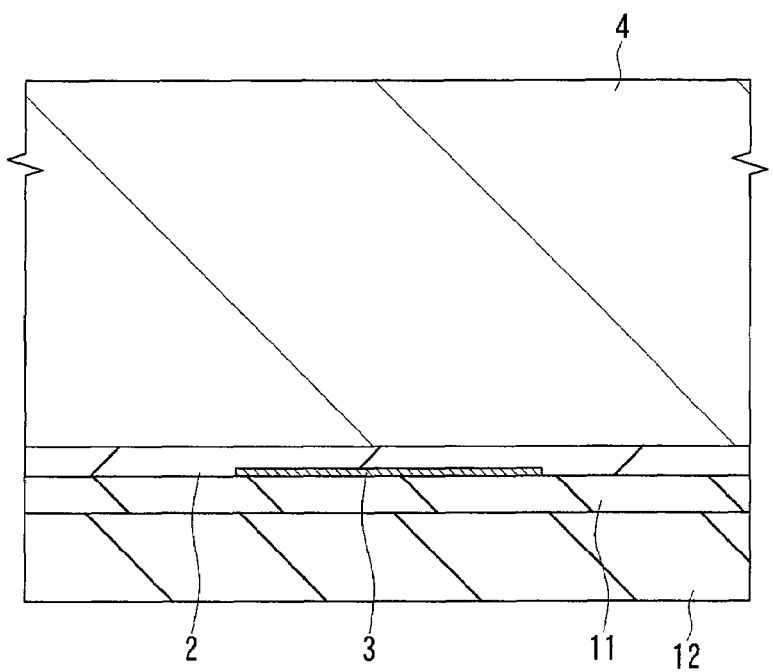
FIG. 4 is a cross-sectional view of the principal part of the same portion as FIG. 3 showing the through electrode of the semiconductor device continued from FIG. 3.

Next, as shown in FIG. 4, a support substrate 12 is bonded to the front surface side of the semiconductor substrate 4 via an adhesive layer 11. For example, quartz, glass or silicon wafer can be used as the support substrate 12. Since the thickness of the semiconductor substrate 4 is reduced to, for example, 10 to 50 μm in the subsequent step, the handling of the semiconductor substrate 4 becomes difficult. However, by bonding the support substrate 12 and the semiconductor substrate 4 together, the rigidity thereof can be increased, and the handling can be facilitated. Further, the processing accuracy and the manufacturing yield can be improved.

The adhesive layer 11 also has a function to protect the surface protection insulating film 2, the element surface electrode 3 and the integrated circuit. Since the support substrate 12 is peeled off from the semiconductor substrate 4 after the rear surface of the semiconductor substrate 4 is processed, a material which can be peeled off is used as the adhesive layer 11. When a thermoplastic resin is used for the adhesive layer 11, the bonding and peeling of the support substrate 12 can be made by softening the adhesive layer 11 by applying heat thereto. Also, when the support substrate 12 is made of quartz or glass and an ultraviolet curable resin is used for the adhesive layer 11, the support substrate 12 can be peeled off by the local or entire heating of the bonding surface by means of laser.

Figure 5:
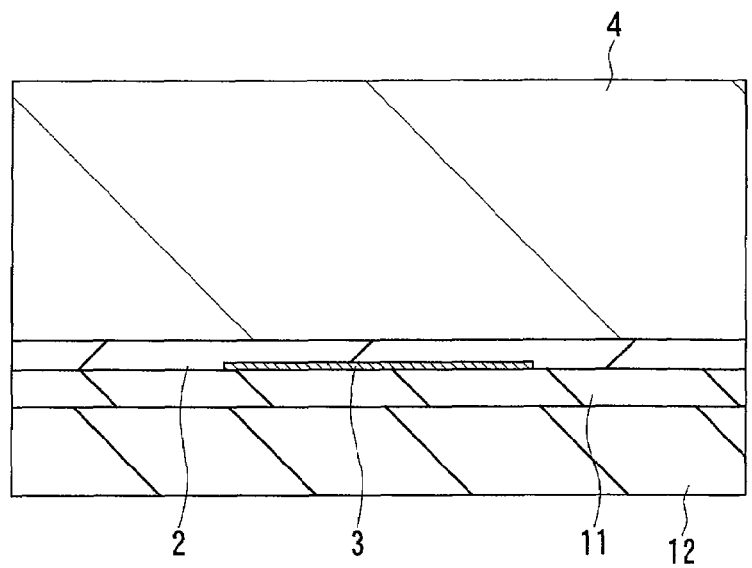
FIG. 5 is a cross-sectional view of the principal part of the same portion as FIG. 3 showing the through electrode of the semiconductor device continued from FIG. 4.

Next, as shown in FIG. 5, the rear surface of the semiconductor substrate 4 is grinded or polished to reduce the thickness of the semiconductor substrate 4 to, for example, 10 to 50 μm. Since the undulation or the roughness on the rear surface of the semiconductor substrate 4 after thinning the semiconductor substrate 4 affects the accuracy of the electrode (pad electrode 9a) formed on the rear surface, CMP, dry polish or etching is preferably adopted as the method of thinning the semiconductor substrate 4. In order to stabilize the connection when a plurality of semiconductor wafers are stacked and shorten the processing time of the subsequent manufacturing process, the appropriate range of the thickness of the semiconductor substrate 4 after thinning the semiconductor substrate 4 is considered to be 50 μm or less (of course, not limited to this range depending on other conditions). Further, the range of 30 μm or less is more preferable. Also, for the reduction of the thickness of the semiconductor device in which a plurality of semiconductor wafers are stacked, the reduction of the thickness of the semiconductor substrate 4 is preferable. However, when the thickness of the semiconductor substrate 4 is reduced to 5 μm or less, the integrated circuit may be damaged and there is a fear of the reduction in manufacturing yield.

Figure 6:
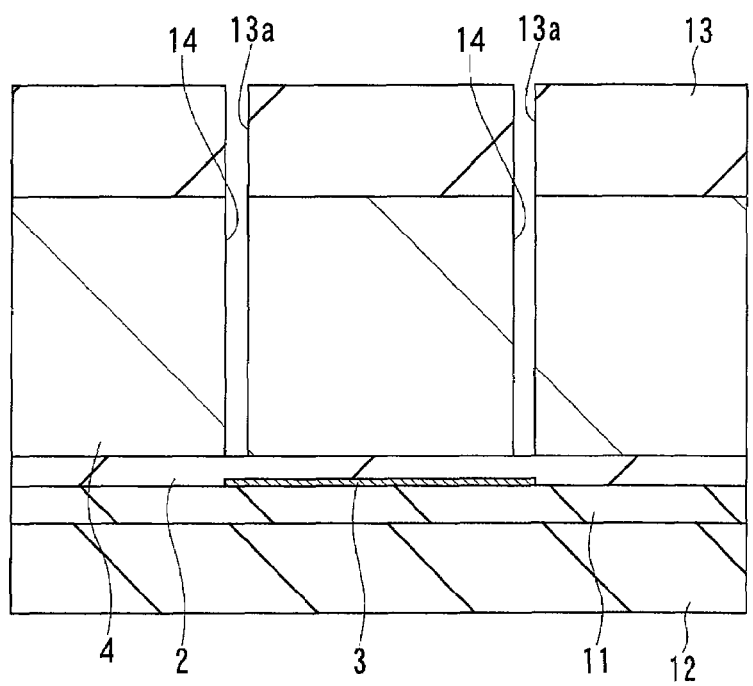
FIG. 6 is a cross-sectional view of the principal part of the same portion as FIG. 3 showing the through electrode of the semiconductor device continued from FIG. 5.
Figure 7:
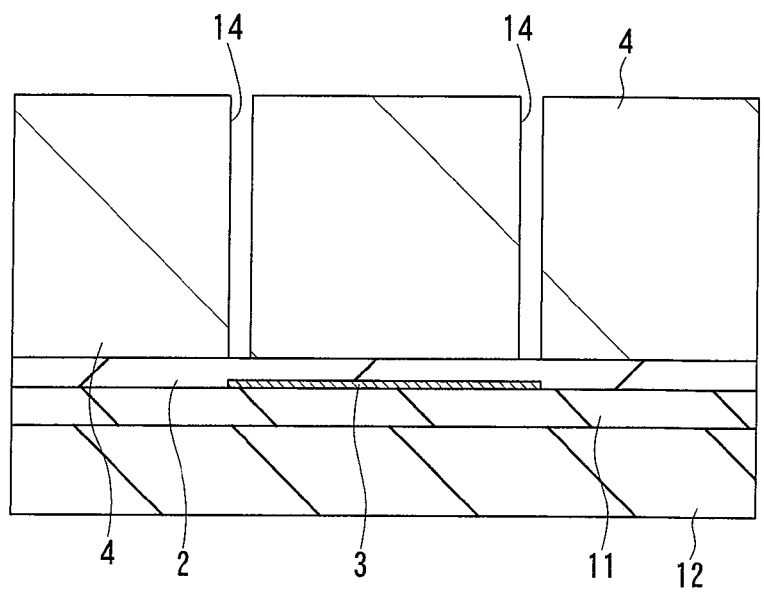
FIG. 7 is a cross-sectional view of the principal part of the same portion as FIG. 3 showing the through electrode of the semiconductor device continued from FIG. 6.

Next, as shown in FIG. 6, a photoresist film 13 is applied to the rear surface of the semiconductor substrate 4, and a ring-shaped resist opening 13a is formed in the photoresist film 13 by, for example, photolithography process. Then, by using the dry etching apparatus of the ICP-RIE (Inductively Coupled Plasma-Reactive Ion Etching) system, the semiconductor substrate 4 in the resist opening 13a is processed with using the photoresist film 13 as a mask, thereby forming the ring-shaped trench 14 in the semiconductor substrate 4. The above-described processing of the semiconductor substrate 4 is not limited to the dry etching apparatus of the ICP-RIE system, and other etching apparatus having equivalent performance can be used instead. The width of the ring-shaped trench 14 is, for example, 2 to 10 μm. Thereafter, as shown in FIG. 7, the photoresist film 13 is removed by organic solvent or oxygen ashing.

Figure 8:
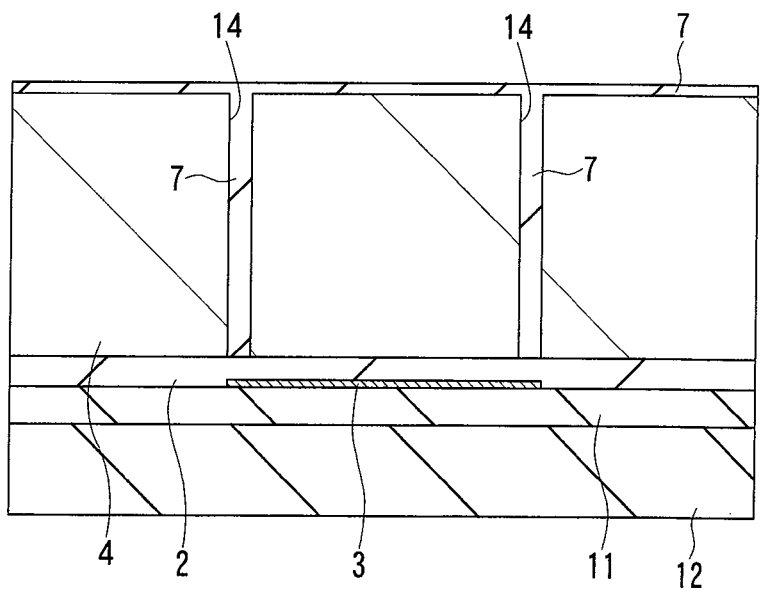
FIG. 8 is a cross-sectional view of the principal part of the same portion as FIG. 3 showing the through electrode of the semiconductor device continued from FIG. 7.

Next, as shown in FIG. 8, the insulating film 7 is formed by CVD (Chemical Vapor Deposition) on the rear surface of the semiconductor substrate 4 including the inside of the trench 14. A silicon oxide film is used as a material of the insulating film 7, and a silicon nitride film or a polyimide resin film can be used instead. Also, the sputtering, the method of coating and sintering sol-gel solution or others may be used as the forming method of the insulating film 7.

Figure 9:
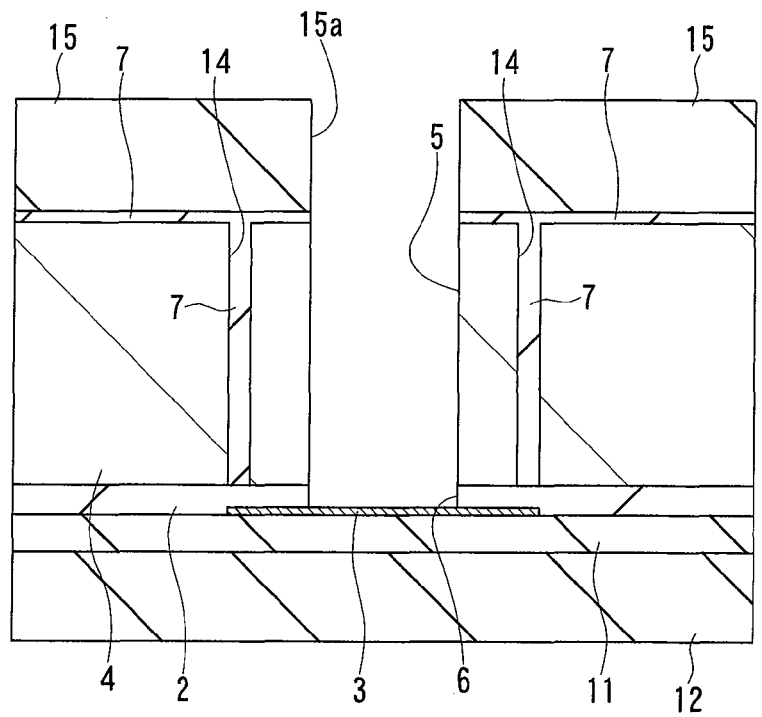
FIG. 9 is a cross-sectional view of the principal part of the same portion as FIG. 3 showing the through electrode of the semiconductor device continued from FIG. 8.
Figure 10:
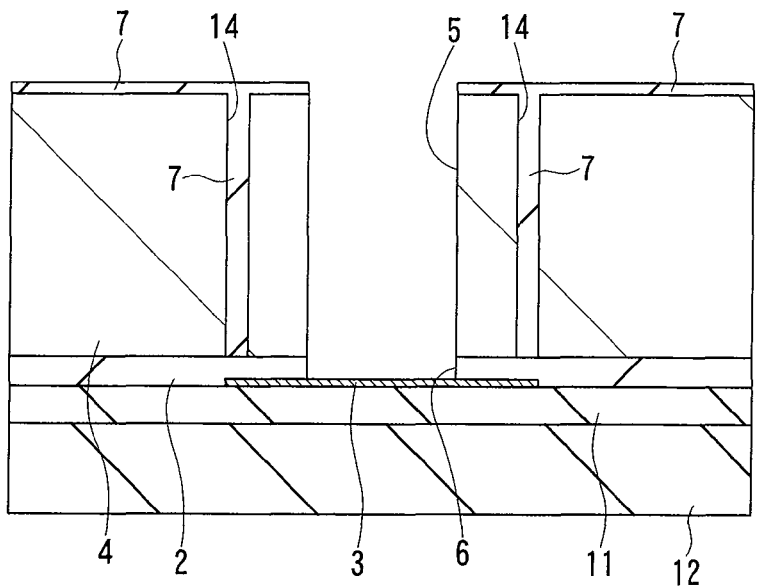
FIG. 10 is a cross-sectional view of the principal part of the same portion as FIG. 3 showing the through electrode of the semiconductor device continued from FIG. 9.

Next, as shown in FIG. 9, a photoresist film 15 is applied on the rear surface of the semiconductor substrate 4, and a resist opening 15a having a diameter smaller than that of the trench 14 is formed on an inner side of the trench 14 in the photoresist film 15 by, for example, photolithography process. Then, by using the dry etching apparatus, the insulating film 7, the semiconductor substrate 4 and the surface protection insulating film 2 in the resist opening 15a are processed with using the photoresist film 15 as a mask. By this means, the through hole 5 is formed in the semiconductor substrate 4, the opening 6 is formed in the surface protection insulating film 2, and the element surface electrode 3 is exposed at the bottom portion of the opening 6. The inner diameter of the through hole 5 and the opening 6 is, for example, 5 to 40 μm. The wet etching can be used for the processing of the insulating film 7 and the surface protection insulating film 2. When the insulating film 7 and the surface protection insulating film 2 are mainly made of silicon oxide, solution mainly containing hydrofluoric acid can be used. Thereafter, as shown in FIG. 10, the photoresist film 15 is removed by organic solvent or oxygen ashing.

Figure 11:
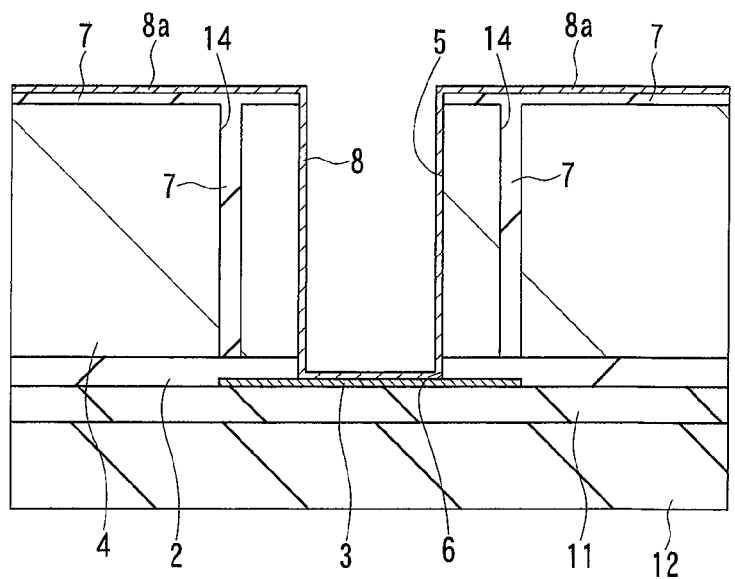
FIG. 11 is a cross-sectional view of the principal part of the same portion as FIG. 3 showing the through electrode of the semiconductor device continued from FIG. 10.

Next, as shown in FIG. 11, a titanium film and a gold film are sequentially deposited on the rear surface of the semiconductor substrate 4 by sputtering, thereby forming the seed layer 8a. The titanium film and the gold film are formed also on inner walls of the through hole 5 formed in the semiconductor substrate 4 and the opening 6 formed in the surface protection insulating film 2 (sidewall and bottom surface), thereby forming the seed layer 8.

When the gold film is directly formed on the single crystal silicon for constituting the semiconductor substrate 4 and the silicon oxide film constituting the surface protection insulating film 2 without forming the titanium film, the seed layers 8 and 8a are easily peeled because adhesion between the gold film and the single crystal silicon or the silicon oxide film is low. Thus, the titanium film is provided below the gold film. The gold film does not have to be thick because it is sufficient for the gold film to have the function as a seed of plating, but the gold film has to be certainly formed as a film on the element surface electrode 3 at the bottom of the opening 6. The thickness of the gold film is, for example, 0.3 to 2 μm. Also, a chromium film can be used instead of a titanium film, and either appropriate film is preferably selected in consideration of the characteristics of the sputtering apparatus. A titanium film is more preferable because it has a film stress lower than that of a chromium film in general, but a chromium film is sometimes used because a titanium film is sensitive to alkaline washing.

Figure 12:
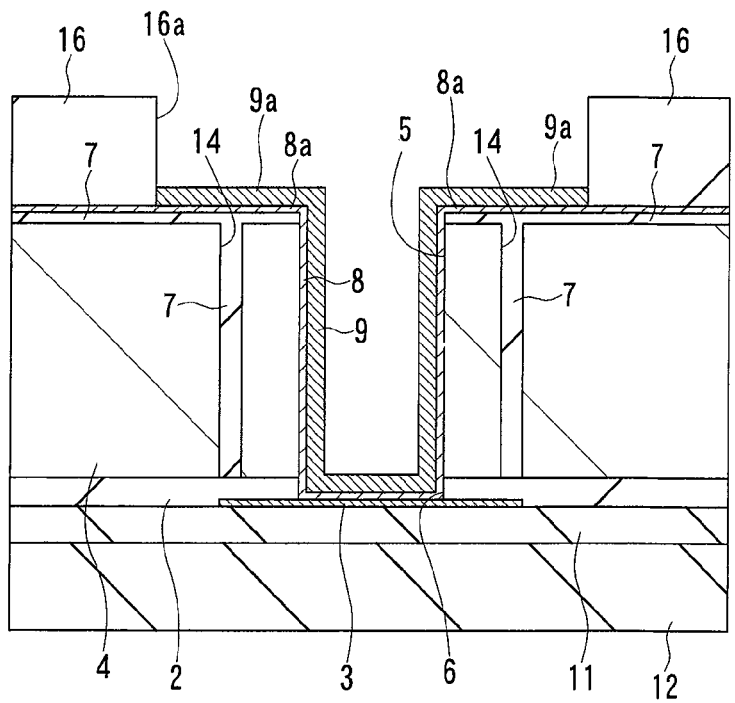
FIG. 12 is a cross-sectional view of the principal part of the same portion as FIG. 3 showing the through electrode of the semiconductor device continued from FIG. 11.

Next, as shown in FIG. 12, a photoresist film 16 is applied to the rear surface of the semiconductor substrate 4, and a plating resist opening 16a is formed in the photoresist film 16 by, for example, the photolithography process. The plating resist opening 16a is formed in the region where electrodes (contact electrode 9 and pad electrode 9a) and wirings are to be formed later. Then, a gold film is formed in the plating resist opening 16a not covered with the photoresist film 16 by electroplating process.

Figure 13:
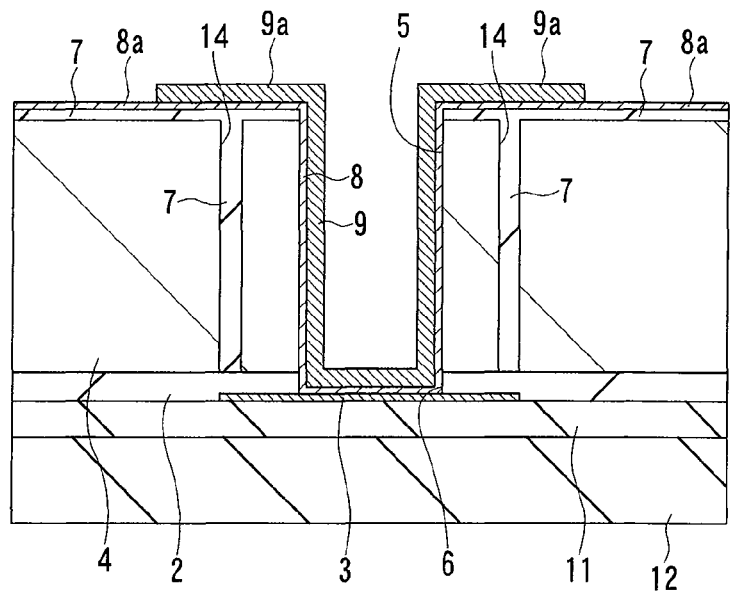
FIG. 13 is a cross-sectional view of the principal part of the same portion as FIG. 3 showing the through electrode of the semiconductor device continued from FIG. 12.

In this manner, the contact electrode 9 constituted of a gold film is formed on the inner walls (sidewall and bottom surface) of the through hole 5 formed in the semiconductor substrate 4 and the opening 6 formed in the surface protection insulating film 2, and the pad electrode 9a and wiring constituted of the gold film are formed at predetermined positions on the rear surface of the semiconductor substrate 4. The thickness of the gold film is preferably 1 μm or larger in consideration of the electric resistance, but the thickness of the gold film is adjusted in practice so that the inside of the through hole 5 is not filled with the gold film when the rear surface processing of the semiconductor wafer is completed. The electroless plating process may be used for the formation of the gold film instead of the electroplating process. Further, the gold film may be formed by sputtering instead of the plating process. Thereafter, as shown in FIG. 13, the photoresist film 16 is removed by organic solvent or oxygen ashing.

Figure 14:
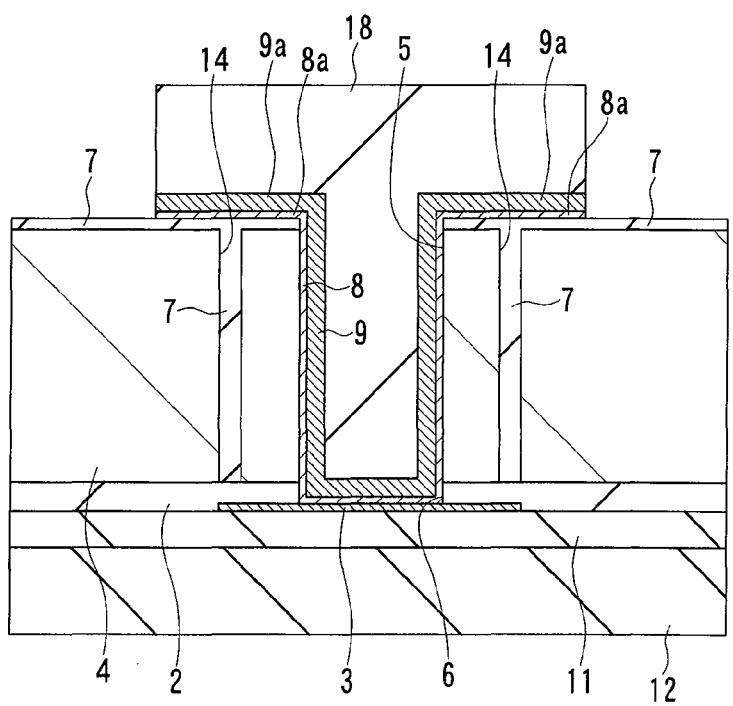
FIG. 14 is a cross-sectional view of the principal part of the same portion as FIG. 3 showing the through electrode of the semiconductor device continued from FIG. 13.

Next, as shown in FIG. 14, a photoresist film is applied to the rear surface of the semiconductor substrate 4, and a resist coating portion 18 that covers the contact electrode 9, the pad electrode 9a and the wiring is formed by, for example, the photolithography process. Then, the seed layer 8a exposed from the resist coating portion 18 is removed by wet etching, thereby exposing the insulating film 7. The gold film constituting the upper layer of the seed layer 8a is etched with solution mainly containing iodine and ammonium iodide, and the titanium film constituting the lower layer of the seed layer 8a is etched with solution mainly containing nitric acid, but other solutions may be used thereto. Thereafter, as shown in FIG. 15, the resist coating portion 18 is removed by organic solvent or oxygen ashing. In this manner, the through electrode PD1 is formed and the rear surface processing of the semiconductor wafer is completed.

Next, the support substrate 12 is peeled off from the semiconductor wafer in which the rear surface processing has been completed. As shown in FIG. 16, a plurality of semiconductor chips 19 are arranged in horizontal and vertical directions on the semiconductor wafer 1, and scribe lines 20 are provided on the four sides of each of the semiconductor chips 19. Subsequently, by using an extremely thin circular blade called a diamond saw, to which diamond particles are attached, the semiconductor wafer 1 is cut vertically and horizontally along the scribe lines 20. By this means, the semiconductor wafer 1 is divided into pieces of the semiconductor chips 19.

Figure 17:
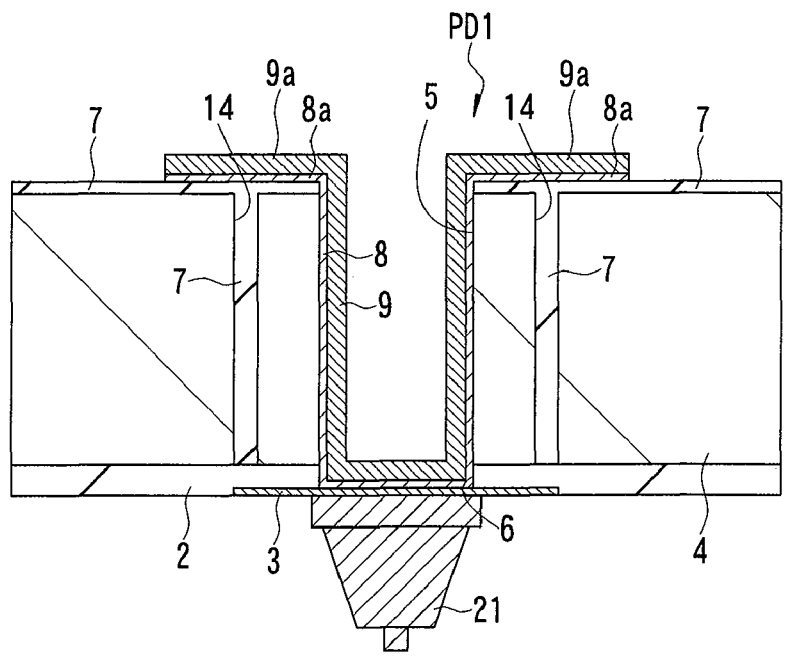
FIG. 17 is a cross-sectional view of the principal part of the same portion as FIG. 3 showing the through electrode of the semiconductor device continued from FIG. 15.

Next, as shown in FIG. 17, a bump 21 is connected to the element surface electrode 3 provided on the surface of the semiconductor chip, and the semiconductor chip to be prepared for assembly is completed.

As described above, according to the first embodiment, since the ring-shaped insulating film 7 is formed in advance in the semiconductor substrate 4 on an outer side of the portion in which the through hole 5 is to be formed when forming the through electrode PD1, thereby insulating the semiconductor substrate 4 and the through electrode PD1, it is not necessary to form an insulating film on an inner wall of the through hole 5. Also, since the insulating film is not formed on the inner wall of the through hole 5, it is not necessary to remove a part of the insulating film on the bottom surface of the through hole 5. Further, since the insulating film is not formed on the inner wall of the through hole 5 and a part of the semiconductor substrate 4 located on an inner side of the ring-shaped insulating film 7 is exposed, it is not necessary to protect the inner wall of the through hole 5 even at the time of the dry etching for forming the opening 6 in the surface protection insulating film 2. Also, since the through electrode PD1 is formed after thinning the semiconductor substrate 4, the semiconductor substrate 4 can be thinned by one process of, for example, CMP or etching. Accordingly, the number of steps in the manufacturing process of the through electrode PD1 can be reduced, and therefore, the manufacturing cost of the semiconductor device can be reduced.

Further, since the through electrode PD1 is formed by the manufacturing process from the rear surface side of the semiconductor substrate 4, when the through hole 5 is to be formed in the semiconductor substrate 4 by, for example, the dry etching using plasma, the influence by plasma on the semiconductor element can be suppressed, and it is possible to reduce the damage on the semiconductor element when the through electrode PD1 is formed.

Second Embodiment

Figure 18:
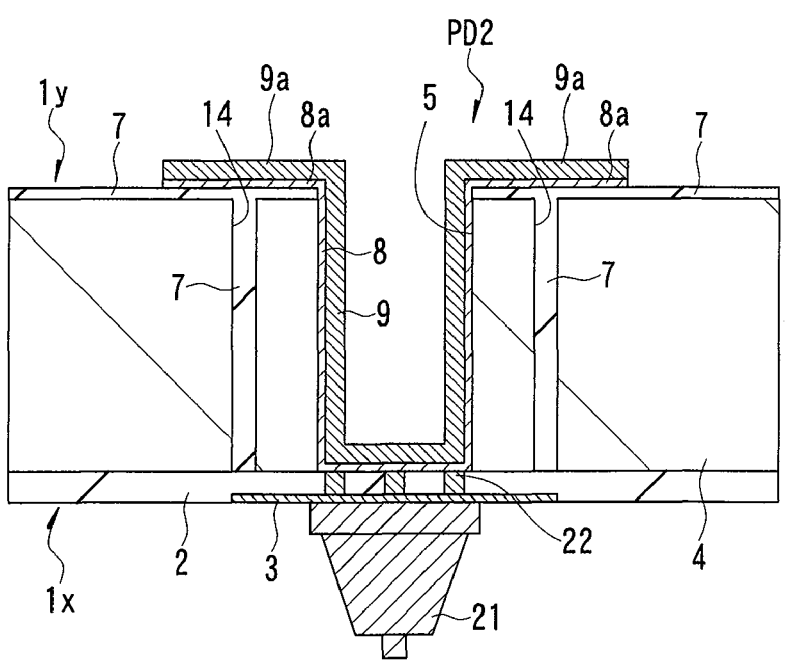
FIG. 18 is a cross-sectional view of the principal part of a through electrode of a semiconductor device according to the second embodiment of the present invention.

A through electrode of a semiconductor device according to the second embodiment will be described with reference to FIG. 18. FIG. 18 is a cross-sectional view of the principal part of the through electrode of the semiconductor device.

The difference from the above-described first embodiment is that the element surface electrode 3 formed on the first surface 1x side of the semiconductor wafer and the contact electrode 9 formed in the semiconductor substrate 4 are electrically connected via a plurality of contact plugs 22. More specifically, in the through electrode PD1 according to the first embodiment described above, the element surface electrodes 3 formed on the first surface 1x side of the semiconductor wafer and the contact electrode 9 formed in the semiconductor substrate 4 are directly connected by forming the opening 6 having the same diameter as the through hole 5 in the surface protection insulating film 2. In the through electrode PD2 according to the second embodiment, however, instead of directly connecting the element surface electrode 3 formed on the first surface 1x side of the semiconductor wafer and the contact electrode 9 formed in the semiconductor substrate 4, the plurality of contact plugs 22 are formed by forming a plurality of holes in the surface protection insulating film 2 therebetween and filling the plurality of holes with a conductive material, and the element surface electrode 3 and the contact electrode 9 are connected via the plurality of contact plugs 22. The inner diameter of the hole is, for example, 1 to 2 μm.

The contact plugs 22 can be formed simultaneously when plugs for connecting the wiring and the semiconductor element or plugs for connecting the upper and lower wirings are formed on the front surface side of the semiconductor substrate 4. Also, by using the contact plugs 22, the step of removing the surface protection insulating film 2 described in the process of FIG. 9 in the first embodiment can be omitted in the manufacturing process of a semiconductor device. Therefore, according to the second embodiment, the number of manufacturing steps of a semiconductor device can be reduced compared with the first embodiment. Accordingly, TAT (turn around time) of the manufacturing process of the semiconductor device can be shortened.

Third Embodiment

Figure 19:
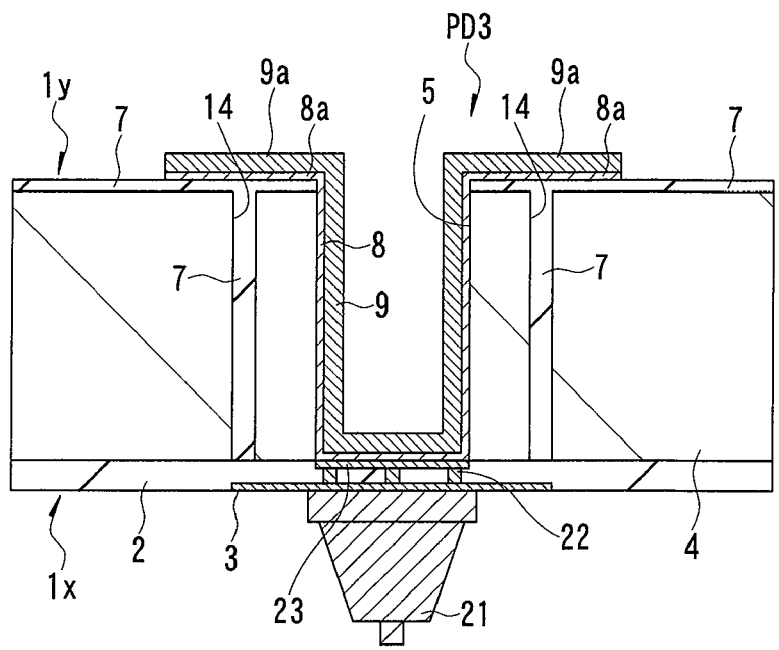
FIG. 19 is a cross-sectional view of the principal part of a through electrode of a semiconductor device according to the third embodiment of the present invention.

A through electrode of a semiconductor device according to the third embodiment will be described with reference to FIG. 19. FIG. 19 is a cross-sectional view of the principal part of the through electrode of the semiconductor device.

The difference from the above-described first embodiment is that the element surface electrode 3 formed on the first surface 1x side of the semiconductor wafer and the contact electrode 9 formed in the semiconductor substrate 4 are electrically connected via a plurality of contact plugs 22 and an inner electrode (fourth electrode) 23. More specifically, in the through electrode PD1 according to the first embodiment described above, the element surface electrode 3 formed on the first surface 1x side of the semiconductor wafer and the contact electrode 9 formed in the semiconductor substrate 4 are directly connected by forming the opening 6 having the same diameter as the through hole 5 in the surface protection insulating film 2. In the through electrode PD3 according to the third embodiment, however, instead of directly connecting the element surface electrode 3 formed on the first surface 1x side of the semiconductor wafer and the contact electrode 9 formed in the semiconductor substrate 4, the element surface electrode 3 and the contact electrode 9 are connected via the plurality of contact plugs 22 formed to be in contact with the element surface electrode 3 and the inner electrode 23 formed to be in contact with the contact electrode 9. The contact plugs 22 are formed by forming a plurality of holes in the surface protection insulating film 2 covering the inner electrode 23 and filling the plurality of holes with a conductive material. The inner diameter of the hole is, for example, 1 to 2 µm.

The contact plugs 22 can be formed simultaneously when plugs for connecting the wiring and the semiconductor element or plugs for connecting the upper and lower wirings are formed on the front surface side of the semiconductor substrate 4, and the inner electrode 23 can be formed simultaneously when wirings are formed on the front surface side of the semiconductor substrate 4. Also, by using the contact plugs 22, the step of removing the surface protection insulating film 2 described in the process of FIG. 9 in the first embodiment can be omitted in the manufacturing process of a semiconductor device. Therefore, according to the third embodiment, the number of manufacturing steps of a semiconductor device can be reduced compared with the first embodiment. Accordingly, TAT of the manufacturing process of the semiconductor device can be shortened.

Further, the inner diameter of the holes in which the contact plugs 22 are formed is as minute as, for example, 1 to 2 µm, and when dry etching is used for the formation of the holes, there is a fear of damage on the semiconductor element. However, since the inner electrode 23 is exposed when the dry etching is completed, the damage of the dry etching on the semiconductor element can be reduced by providing the inner electrode 23.

Fourth Embodiment

A through electrode of a semiconductor device according to the fourth embodiment will be described with reference to FIG. 20. FIG. 20 is a cross-sectional view of the principal part of the through electrode of the semiconductor device.

The difference from the above-described first embodiment is that the ring-shaped insulating film 7 formed in the semiconductor substrate 4 around the contact electrode 9 does not completely fill the inside of the trench 14. More specifically, the above-described first embodiment has shown the through electrode PD1 in which the inside of the trench 14 formed in the semiconductor substrate 4 around the contact electrode 9 is completely filled with the insulating film 7. In the through electrode PD4 according to the fourth embodiment, however, the insulating film 7 does not completely fill the inside of the trench 14 formed in the semiconductor substrate 4 around the contact electrode 9 and a cavity 24 in which the insulating film 7 is not formed is partly left, and the insulating film 7 and the cavity 24 insulate the contact electrode 9 and the semiconductor substrate 4.

The width of the trench 14 is as minute as, for example, 2 to 10 µm, and thus, it is difficult to completely fill the inside of the trench 14 with the insulating film 7 and the cavity 24 is sometimes formed therein. In such a case, however, the trench 14 has a function to insulate the through electrode PD4 from the surrounding semiconductor substrate 4. Therefore, since the insulating film 7 can be formed by the deposition system and the forming conditions used generally, the through electrode PD4 can be formed simply at low cost.

Fifth Embodiment

A semiconductor device with the SIP (Single In-line Package) structure in which semiconductor chips are three-dimensionally stacked according to the fifth embodiment will be described with reference to FIG. 21. FIG. 21 is a cross-sectional view of the principal part of the semiconductor device with the SIP structure. The semiconductor chips having the through electrode PD1 manufactured in the first embodiment are used here, but the semiconductor chips having the through electrode PD2, PD3 or PD4 manufactured in the second, third or fourth embodiment may be used.

As shown in FIG. 21, a semiconductor chip 51a constituted of a microcomputer chip and a semiconductor chip 51c constituted of a SDRAM (Synchronous Dynamic Random Access Memory) are three-dimensionally stacked via a semiconductor chip 51b functioning as an interposer chip for rewiring. Also, the three stacked semiconductor chips 51a, 51b and 51c are mounted on a wiring board 52.

The semiconductor chip 51a constituted of a microcomputer chip is a semiconductor chip in which a highly integrated circuit is formed, and it has through electrodes 53a and stacked bump electrodes 54a each connected to an element surface electrode formed therein. Similarly, the semiconductor chip 51c constituted of a SDRAM is a semiconductor chip in which a highly integrated circuit is formed, and it has through electrodes 53c and stacked bump electrodes 54c each connected to an element surface electrode formed therein. On the other hand, the semiconductor chip 51b is an interposer chip, and it has through electrodes 53b and stacked bump electrodes 54b each connected to an element surface electrode formed therein.

Then, the semiconductor chip 51a is mounted on the wiring board 52 so that the stacked bump electrodes 54a formed on the semiconductor chip 51a and the electrodes 55 formed on the wiring board 52 are electrically connected. At this time, the electrical connection between the semiconductor chip 51a and the semiconductor chip 51b is made by inserting the stacked bump electrodes 54b formed on the semiconductor chip 51b into the through electrodes 53a formed in the semiconductor chip 51a. Further, the semiconductor chip 51c is mounted on the semiconductor chip 51b. Then, the electrical connection between the semiconductor chip 51b and the semiconductor chip 51c is made by inserting the stacked bump electrodes 54c formed on the semiconductor chip 51c into the through electrodes 53b formed in the semiconductor chip 51b.

On the surface of the wiring board 52 opposite to the surface where the semiconductor chips 51a, 51b and 51c are mounted, solder bump electrodes 56 are formed. The solder bump electrode 56 is electrically connected to the electrode 55 via the inside of the wiring board 52. The solder bump electrode 56 functions as an external terminal for the electrical connection to the outside of the semiconductor device.

Further, sealing adhesive 57 is formed so as to fill the gaps of the wiring board 52 and the semiconductor chips 51a, 51b and 51c. The sealing adhesive 57 has a function to increase the mechanical strength of the semiconductor device to improve the handling properties in the assembly process of the semiconductor device and to protect the semiconductor device from external environments.

Next, the manufacturing process of a semiconductor device with a SIP structure in which the semiconductor chips are three-dimensionally stacked according to the fifth embodiment will be described. First, a first stacking example of the above-described three semiconductor chips 51a, 51b and 51c will be described.

For example, by performing the process described in the first embodiment to each of the chip regions on a first semiconductor wafer, the through electrodes 53a electrically connected to the element surface electrodes formed in each of the chip regions of the first semiconductor wafer are formed. Thereafter, the first semiconductor wafer is divided into pieces of the semiconductor chips to acquire the semiconductor chips 51a. Then, in the semiconductor chip 51a, the stacked bump electrodes 54a are formed on the element surface electrodes.

Similarly, by performing the process described in the first embodiment to each of the chip regions on a second semiconductor wafer, the through electrodes 53b electrically connected to the element surface electrodes formed in each of the chip regions of the second semiconductor wafer are formed. Thereafter, the second semiconductor wafer is divided into pieces of the semiconductor chips to acquire the semiconductor chips 51b. Then, in the semiconductor chip 51b, the stacked bump electrodes 54a are formed on the element surface electrodes.

Subsequently, the semiconductor chip 51b is stacked on and electrically connected to the semiconductor chip 51a. In this step, the stacked bump electrodes 54b formed on the semiconductor chip 51b are deformed and inserted by pressure welding into the through electrodes 53a formed in the semiconductor chip 51a, and "caulking effect" is produced.

As described above, the semiconductor device can be formed by respectively forming the semiconductor chip 51a and the semiconductor chip 51b and then stacking the chips. Note that the semiconductor chip 51c can be stacked on the semiconductor chip 51b in the same manner. In the above-described manner, after the semiconductor chips 51a, 51b and 51c are stacked together, the stacked bump electrodes 54a of the semiconductor chip 51a are fixed by the thermocompression bonding to the wiring board 52 and are electrically connected to the electrodes 55 of the wiring board 52. Thereafter, the sealing adhesive 57 is filled in the gaps of the respective semiconductor chips 51a, 51b and 51c and the gap between the semiconductor chip 51a and the wiring board 52. In this manner, the stacking of the semiconductor chips 51a, 51b and 51c is completed.

In the above-described stacking method, the semiconductor chips 51a, 51b and 51c are first stacked, and then the stacked body of the semiconductor chips 51a, 51b and 51c is mounted on the wiring board 52. As another stacking method, after the stacked bump electrodes 54a of the semiconductor chip 51a are first thermocompression bonded to the electrodes 55 of the wiring board 52 to stack the semiconductor chip 51a on the wiring board 52, the semiconductor chip 51b is stacked thereon, the semiconductor chip 51c is stacked further thereon, and finally, the sealing adhesive 57 is filled. As still another stacking method, after the semiconductor chip 51a is integrally stacked on the wiring board 52, and the semiconductor chip 51b and the semiconductor chip 51c are integrally stacked separately, the respective stacked bodies are stacked together, and finally, the sealing adhesive 57 is filled.

In the case where the thickness of the semiconductor chips 51a, 51b and 51c is as small as, for example, 30 µm or less, the semiconductor chips 51a, 51b and 51c are sometimes warped due to the stress or the semiconductor chips 51a, 51b and 51c are sometimes cracked when they are stacked and then pressed. Therefore, it is desired that the semiconductor chips 51a, 51b and 51c are stacked by an appropriate method in accordance with the types of the semiconductor chips 51a, 51b and 51c, for example, specifications such as a memory chip and a microcomputer chip.

Next, a second stacking example of the above-described semiconductor chips 51a, 51b and 51c will be described.

For example, after performing the process described in the first embodiment to each chip region of the first semiconductor wafer, thereby forming the through electrodes 53a electrically connected to the element surface electrodes formed in each chip region of the first semiconductor wafer, the stacked bump electrodes 54a are formed on the element surface electrodes. As described above, the stacked bump electrodes 54a can be formed in a state of the semiconductor wafer.

Similarly, after performing the process described in the first embodiment to each chip region of the second semiconductor wafer, thereby forming the through electrodes 53b electrically connected to the element surface electrodes formed in each chip region of the second semiconductor wafer, the stacked bump electrodes 54b are formed on the element surface electrodes.

Thereafter, the second semiconductor wafer is stacked on and electrically connected to the first semiconductor wafer. In this step, the stacked bump electrodes 54b formed on the second semiconductor wafer are deformed and inserted by pressure welding into the through electrodes 53a formed in the first semiconductor wafer. As described above, the stacking in a state of the semiconductor wafer is also possible.

Sixth Embodiment

In the process described in the first embodiment, the steps shown in FIG. 12 to FIG. 14 can be replaced with the following steps. After forming the seed layers 8 and 8a as shown in FIG. 11 through the same steps as the first embodiment, the plating is performed to the entire second surface 1y of the semiconductor wafer. By this means, the electrodes 9 and 9a are simultaneously formed. Thereafter, as shown in FIG. 14, the resist coating portion 18 is formed by, for example, the photolithography process, and the plating film and the seed layer other than the electrodes 9 and 9a and the wirings are removed. According to this embodiment, since the photolithography process in FIG. 12 and FIG. 13 can be omitted, the manufacturing process is simplified, and since the number of photomasks to be used in the photolithography process can be reduced, the cost reduction can be achieved.

Next, the first semiconductor wafer and the second semiconductor wafer in the stacked state are divided into pieces of semiconductor chips. In this manner, the stacked structure of the semiconductor chip 51a and the semiconductor chip 51b can be obtained. Note that the semiconductor chip 51c can be stacked on the semiconductor chip 51b in the same manner.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to the through electrode formed in a semiconductor device in which a plurality of semiconductor chips are three-dimensionally stacked and the manufacture thereof.

What is claimed is:

1. A semiconductor device comprising:
   a semiconductor substrate having a first surface and a second surface opposite to the first surface;
   a semiconductor element formed on the first surface of the semiconductor substrate;

a first insulating film formed on and covering the second surface of the semiconductor substrate;

a first electrode formed on the first insulating film and connected to an external electrode;

a through hole penetrating through the semiconductor substrate from the first surface to the second surface, to the insulating layer, and exposing the first electrode;

a seed layer including a first portion formed on inner walls of the through hole and a second portion formed on the second surface of the semiconductor substrate around the through hole, wherein the first portion is directly contacted the substrate, the first insulating film, and the first electrode; and a second electrode including a first portion formed on the second surface of the semiconductor substrate around the through hole and a second portion formed on the inner walls of the through hole, the second electrode is directly contacted the seed layer, wherein the semiconductor device further comprises:

a ring-shaped trench formed in the semiconductor substrate around the through hole so as to have a predetermined distance from the through hole; and a second insulating film formed inside the ring-shaped trench and between the second surface of the semiconductor substrate and the seed layer, and a space is present inside the through hole after the second electrode is formed.

2. The semiconductor device according to claim 1, wherein an inner diameter of the through hole and an inner diameter of the opening are equal to each other.

3. The semiconductor device according to claim 1, wherein the second insulating film is completely filled inside the ring-shaped trench.

4. The semiconductor device according to claim 1, wherein a width of the ring-shaped trench is 2 to 10 μm.

5. The semiconductor device according to claim 1, wherein no insulating film is formed between the inner walls of the through hole and the seed layer.

\* \* \* \* \*